United States Patent
Sagebaum

(10) Patent No.: US 10,665,562 B2
(45) Date of Patent: May 26, 2020

(54) POWER ELECTRONICS ASSEMBLY HAVING AN ADHESION LAYER, AND METHOD FOR PRODUCING SAID ASSEMBLY

(71) Applicant: SEMIKRON ELEKTRONIK GMBH & CO. KG, Nuremberg (DE)

(72) Inventor: Ulrich Sagebaum, Feucht (DE)

(73) Assignee: SEMIKRON ELEKTRONIK GmbH & Co. KG, Nuremberg (DE)

( * ) Notice: Subject to any disclaimer, the term of this patent is extended or adjusted under 35 U.S.C. 154(b) by 9 days.

(21) Appl. No.: 16/020,378

(22) Filed: Jun. 27, 2018

(65) Prior Publication Data

US 2019/0043820 A1 Feb. 7, 2019

(30) Foreign Application Priority Data

Aug. 3, 2017 (DE) .......................... 10 2017 117 668

(51) Int. Cl.
*H01L 23/00* (2006.01)
*H01L 23/14* (2006.01)
*H01L 23/15* (2006.01)

(52) U.S. Cl.
CPC ............ *H01L 24/29* (2013.01); *H01L 23/145* (2013.01); *H01L 23/15* (2013.01); *H01L 24/27* (2013.01); *H01L 24/32* (2013.01); *H01L 24/50* (2013.01); *H01L 24/83* (2013.01); *H01L 24/05* (2013.01); *H01L 24/33* (2013.01); *H01L 24/75* (2013.01);
(Continued)

(58) Field of Classification Search
None
See application file for complete search history.

(56) References Cited

U.S. PATENT DOCUMENTS

| 5,138,428 A | 8/1992 | Hainz et al. |
| 5,770,468 A | 6/1998 | Kosaki |

(Continued)

FOREIGN PATENT DOCUMENTS

| DE | 102014222819 | 5/2016 |
| DE | 102016108000 | 12/2016 |

(Continued)

OTHER PUBLICATIONS

DE 10 2017 117 668. 3, Examination Report dated Apr. 23, 2018, 2 pages—English, 3 pages—German.

(Continued)

*Primary Examiner* — Nishath Yasmeen
(74) *Attorney, Agent, or Firm* — Lackenbach Siegel, LLP; Andrew F. Young

(57) ABSTRACT

A power electronics method and assembly produced by the method. The assembly has a substrate, having a power semiconductor element, and an adhesion layer disposed therebetween, wherein the substrate has a first surface that faces a power semiconductor element, a power semiconductor element has a third surface that faces the substrate, the adhesion layer has a second surface which, preferably across the full area, contacts the third surface and has a first consistent surface contour having a first roughness, and wherein a fourth surface of the power semiconductor element that is opposite the third surface has a second surface contour having a second roughness, said second surface contour following the first surface contour.

13 Claims, 2 Drawing Sheets

(52) U.S. Cl.
CPC .............. *H01L 24/79* (2013.01); *H01L 24/86* (2013.01); *H01L 2224/04026* (2013.01); *H01L 2224/2732* (2013.01); *H01L 2224/2783* (2013.01); *H01L 2224/2784* (2013.01); *H01L 2224/291* (2013.01); *H01L 2224/29017* (2013.01); *H01L 2224/29019* (2013.01); *H01L 2224/2919* (2013.01); *H01L 2224/29294* (2013.01); *H01L 2224/29339* (2013.01); *H01L 2224/32227* (2013.01); *H01L 2224/33181* (2013.01); *H01L 2224/50* (2013.01); *H01L 2224/73269* (2013.01); *H01L 2224/75303* (2013.01); *H01L 2224/79303* (2013.01); *H01L 2224/8384* (2013.01); *H01L 2224/83345* (2013.01); *H01L 2224/83447* (2013.01); *H01L 2224/83862* (2013.01); *H01L 2224/8684* (2013.01); *H01L 2924/10158* (2013.01)

(56) References Cited

U.S. PATENT DOCUMENTS

| | | | | |
|---|---|---|---|---|
| 6,184,064 | B1* | 2/2001 | Jiang | H01L 24/32 257/739 |
| 9,394,466 | B2* | 7/2016 | Sherman | C09J 7/38 |
| 2003/0214021 | A1* | 11/2003 | Zhou | H01L 21/565 257/678 |
| 2011/0272824 | A1* | 11/2011 | Pagaila | H01L 24/96 257/777 |
| 2012/0052631 | A1* | 3/2012 | Mcmillan | H01L 21/4832 438/108 |
| 2014/0291825 | A1* | 10/2014 | Yoneyama | H01L 24/32 257/676 |
| 2015/0311144 | A1* | 10/2015 | Williams | H01L 23/4952 257/675 |
| 2017/0358525 | A1* | 12/2017 | Ge | H01L 23/4985 |

FOREIGN PATENT DOCUMENTS

| | | |
|---|---|---|
| DE | 102017117668 | 9/2018 |
| EP | 2257142 | 12/2010 |

OTHER PUBLICATIONS

DE 10 2017 117 668.3, Notice of Grant dated Jul. 31, 2018, 3 pages—German, 3 pages—English.

* cited by examiner

POWER ELECTRONICS ASSEMBLY HAVING AN ADHESION LAYER, AND METHOD FOR PRODUCING SAID ASSEMBLY

CROSS REFERENCE TO RELATED APPLICATION

This application relates to, and claims priority from, Ser. No.: DE 10 2017 117 668.3 filed Aug. 3, 2017, the entire contents of which are incorporated herein by reference.

BACKGROUND OF THE INVENTION

Field of the Invention

The present invention relates to a power electronics assembly.

More specifically, the invention relates to a power electronics assembly having a substrate, having a power semiconductor element, and an adhesion layer that is disposed therebetween. The invention furthermore describes a method for configuring a power electronics assembly of this type.

Description of the Related Art

It is current knowledge from the generally known prior art that adhesion layers are disposed on a substrate by means of various methods, for example by means of screen printing or stencil printing. Thereafter, the mating partner, in particular configured as a power semiconductor element, is disposed on the adhesion layer. Depending on the design embodiment of the addition layer, yet further industry-standard method steps are performed in order to finally configure a materially integral connection between the substrate and the power semiconductor element. Industry-standard methods are, in particular, soldering, adhesive bonding, and pressure-sintering methods.

An insufficient durability of the materially integral connections, in particular under temperature fluctuations, is a frequent disadvantage.

ASPECTS AND SUMMARY OF THE INVENTION

According to one aspect of the present invention, there is provided a power electronics method and assembly produced by the method. The assembly has a substrate, having a power semiconductor element, and an adhesion layer disposed therebetween, wherein the substrate has a first surface that faces a power semiconductor element, a power semiconductor element has a third surface that faces the substrate, the adhesion layer has a second surface which, preferably across the full area, contacts the third surface and has a first consistent surface contour having a first roughness, and wherein a fourth surface of the power semiconductor element that is opposite the third surface has a second surface contour having a second roughness, said second surface contour following the first surface contour.

Acknowledging the conditions mentioned, the invention is based on the object of specifying a power electronics assembly and a method for producing the latter, wherein the durability of the materially integral connection is improved.

This object is achieved according to the invention by a power electronics assembly having the features of the claims, and by a method having the features of the claims. Preferred embodiments are described in the respective dependent claims.

The power electronics assembly according to the invention is configured having a substrate, having a power semiconductor element, and an adhesion layer disposed therebetween, wherein the substrate has a first surface that faces the power semiconductor element, wherein the power semiconductor element has a third surface that faces the substrate, wherein the adhesion layer has a second surface which, preferably across the entire area, contacts the third surface and has a first consistent surface contour having a first roughness, and wherein a fourth surface of the power semiconductor element that is opposite the third surface has a second surface contour having a second roughness, said second surface contour following the first surface contour. The term following the contour is to be understood herein and hereunder that both contours have a three-dimensional structure of identical type, wherein the height of the structure does not have to be the same. The term roughness is to be understood herein and hereunder as the mean roughness Ra according to DIN 4760. Power electronics assemblies configured in this manner have the substantial advantage that the connection between the second and the third surface is substantially improved. This is due to the three-dimensional characteristic in conjunction with the fineness of the structure, thus the roughness.

In one preferred design embodiment of the assembly, the value of the second roughness is between 50% and 100%, preferably between 85% and 99%, and particularly preferably between 95% and 99% of the value of the first roughness.

It can be advantageous for the first roughness to be configured so as to vary in a consistent or inconsistent manner from the centre of the power semiconductor element towards the outside. The first roughness, assigned to the centre of the power semiconductor element, can thus be higher or lower than on the periphery of the power semiconductor element.

It can also be preferable for a first mean thickness of the adhesion layer (2), determined in the centre of and underneath the power semiconductor element, is between 10 μm and 200 μm, preferably between 20 μm to 100 μm, and particularly preferably between 10 μm and 30 μm, or between 50 μm and 80 μm. The first range of values herein is particularly preferable for sintered metal layers, while the second range of values is preferable in the case of solder layers. There is no clearly preferred limited range of values for adhesive layers, since the specific properties of the layer conjointly determine the preferred range of values. A mean thickness is to be understood herein and hereunder as the mean value of a range which is sufficiently large in order for influences of the roughness in the determination of the thickness to be averaged. In other words, the value of the mean thickness does not consider the roughness of the assigned surfaces since the thickness is measured up to the centre line of the determination of the roughness.

The first roughness preferably has a value between 5% and 50%, preferably between 10% and 30%, and particularly preferably between 15% and 20% of the first mean thickness of the adhesion layer.

It can be advantageous for a second mean thickness of the adhesion layer, determined on the periphery of and underneath the power semiconductor element, has a value of at maximum 95%, preferably of at maximum 90%, and particularly preferably of at maximum 80% of the first mean thickness.

In one preferred design embodiment the substrate is configured so as to be rigid, in particular so as to have a ceramic substrate carrier having a metallic conductor path disposed thereon. In an alternatively preferred design embodiment the substrate is configured so as to be flexible, in particular so as to have a film/foil-type, electrically isolating substrate carrier having a metallic conductor path disposed thereon.

The method according to the invention for producing an assembly according to the invention mentioned above comprises the following method steps in the sequence a-b-c-d-e, wherein steps b) and c) can be carried out simultaneously, or a-c-b-d-e:

a) providing the substrate and the power semiconductor element;
b) disposing the adhesion layer on the first surface of the substrate;
c) structuring the second surface of the adhesion layer for configuring a consistent surface structure;
d) disposing the power semiconductor element, wherein the third surface thereof comes to lie on the second surface of the adhesion layer;
e) connecting the power semiconductor element to the adhesion layer.

It can be advantageous herein for the adhesion layer to be disposed on the first surface of the substrate by means of a screen printing method, and for the surface structure to be at least initially configured, thus not in a final manifestation, in particular a not yet final first roughness, by the screen printing method.

The adhesion layer can alternatively be disposed on the first surface of the substrate by means of a stencil printing method. The surface structure herein can be generated by an embossing stamp.

A further potential alternative is for the adhesion layer to be disposed on an intermediate carrier, in particular a carrier plate or a carrier film/foil, and to be disposed from the intermediate carrier onto the first surface of the substrate by means of a transfer method. The surface structure herein can be generated by a negative structure of a fifth surface of the intermediate carrier.

In as far as this is not excluded explicitly or per se, or contradicts the concept of the invention, the features that are in each case mentioned in the singular, in particular the power semiconductor element and the adhesion layer, can of course be present in multiples in the context of the pressure-sintering method.

It is understood that the various design embodiments of the invention, independently of whether the latter are mentioned in the context of the assembly or of the method, can be implemented individually or in arbitrary combinations in order for improvements to be achieved. In particular, the features mentioned and explained above and hereunder can be used not only in the combinations set forth, but also in other combinations or individually, without departing from the scope of the present invention.

Further explanations of the invention, advantageous details and features are derived from the following description of the exemplary embodiments of the invention which are illustrated schematically and not-to-scale throughout in FIGS. 1 to 5, or from respective parts thereof.

The above and other aspects, objects, features and advantages of the present invention will become apparent from the following description read in conjunction with the accompanying drawings, in which like reference numerals designate the same elements.

DETAILED DESCRIPTION OF THE PREFERRED EMBODIMENTS

Figure 1:
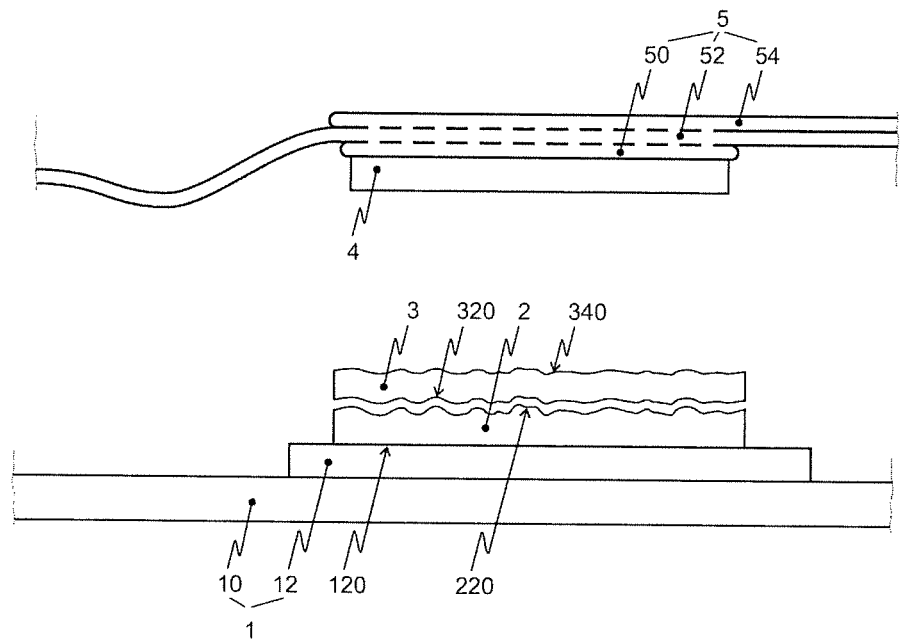
FIG. 1 shows a first power electronics assembly according to the invention, having an additional connection installation.

Reference will now be made in detail to embodiments of the invention. Wherever possible, same or similar reference numerals are used in the drawings and the description to refer to the same or like parts or steps. The drawings are in simplified form and are not to precise scale. The word 'couple' and similar terms do not necessarily denote direct and immediate connections, but also include connections through intermediate elements or devices. For purposes of convenience and clarity only, directional (up/down, etc.) or motional (forward/back, etc.) terms may be used with respect to the drawings. These and similar directional terms should not be construed to limit the scope in any manner. It will also be understood that other embodiments may be utilized without departing from the scope of the present invention, and that the detailed description is not to be taken in a limiting sense, and that elements may be differently positioned, or otherwise noted as in the appended claims without requirements of the written description being required thereto.

In the present text, numerous specific details are set forth in order to provide a thorough understanding of exemplary versions of the present invention. It will be apparent, however, to one skilled in the art, that some versions of the present invention may possibly be practiced without some of these specific details. Indeed, reference in this specification to "an embodiment", "variants," and "one/the embodiment/variant," or "one version," "a version" and the like, should be understood to mean that a particular feature, structure, or characteristic described in connection with the variant or version is included in at least one such embodiment or variant or version according to the disclosure. Thus, the appearances of elements in one embodiment, version, or variant will be understood to be adaptively applicable to other embodiments, versions, or variants and that one embodiment does not necessarily refer to the same embodiment, version or variant. Nor are separate or alternative versions or variants mutually exclusive of other versions or variants. Moreover, various features may be described which possibly may be exhibited by some variants or versions and not by others.

Various operations may be described as multiple discrete operations in turn, in a manner that may be helpful in understanding embodiments of the present invention; however, the order of description should not be construed to imply that these operations are order dependent.

FIG. 1 shows a first power electronics assembly according to the invention, having an additional connection installation 5. A fundamentally industry-standard power electronics substrate 1, here configured so as to have a rigid substrate carrier 10, configured as an insulation material member, in particular made from industrial ceramics, having a thickness of 300 µm, is illustrated. A conductor path 12 which is configured as a copper laminate, likewise having a thickness of 300 µm, is disposed on said insulation material member 10. It is an industry standard for also a thin precious metal layer to be disposed on said copper laminate, said thin precious metal layer thus having a first surface 120.

For an electrically and thermally conducting, materially integral connection between said conductor path 12 and a power semiconductor element 2, in an exemplary manner a transistor or a diode, it is the industry standard for this connection to be configured by means of a sintered connection, in particular a pressure-sintered connection. To this end, the power semiconductor element 3 has a third surface 320 that faces the first surface, a thin precious metal in the industry standard likewise being disposed on said third surface 320.

An adhesion layer 2 which here is configured as a sintered metal layer is disposed between the first surface 120, and the third surface 320. A sintered metal layer in the industry-standard is created from a sintered material, preferably configured from a suspension of a liquid and silver flakes, which is disposed between two mating partners. This sintered material is transferred into the sintered metal layer by the influence of pressure and in most instances additionally of temperature on the two mating partners.

The sintered metal layer 2 here has a mean thickness of approx. 20 µm across the entire extent. Moreover, said sintered metal layer 2, more specifically the second surface 220 thereof that faces the power semiconductor element 3, according to the invention has a first consistent surface contour having a first roughness. The surface contour of the second surface 220 in the case of this first power electronics assembly is configured so as to be irregular. The first roughness of the second surface 220 here has a value Ra of approx. 4 µm.

The power semiconductor element 3 is illustrated so as to be spaced apart purely for reasons of clarity. Industry-standard power semiconductor elements such as that illustrated here have a thickness in the range of approx. 50 µm to 120 µm, which is why said power semiconductor elements, despite having a crystal structure, are flexible within certain limits. The third surface 320 contacts the second surface 220 across almost the entire area.

The fourth surface 340 of the power semiconductor element 3 lies opposite the third surface 320 and according to the invention has a second surface contour having a second roughness, wherein the second surface contour, on account of the above-mentioned process of configuring the sintered connection, follows the first surface contour. The second roughness of this fourth surface 340 is approx. 98% of the value of the first roughness. In other words, the structure of the sintered layer is quasi reproduced on the fourth surface 340 of the power semiconductor element 3 and in this design embodiment is identifiable without visual aids.

In order for the first surface contour having the first roughness to be configured, the desired first surface contour in method step c) of the method according to the invention can be configured in that said first surface contour is embossed in the second surface 220 of the sintered material by means of an embossing stamp, that is to say prior to the configuration of the sintered connection and to the conversion of the sintered material to a sintered metal. At the point of time of embossing, the roughness can still have a value which corresponds to double the value of the second surface of the later sintered metal layer.

A further electrically conducting connection of the power semiconductor element 3, specifically that of the fourth surface 340 of the latter, is furtheimore illustrated so as to be spaced apart purely for reasons of clarity. This fourth surface by way of a further layer from a sintered metal 4 is connected to a connection installation 5. This connection installation in the industry standard is composed of a layer sequence of electrically conducting and electrically isolating films/foils 50, 52, 54.

Figure 2:
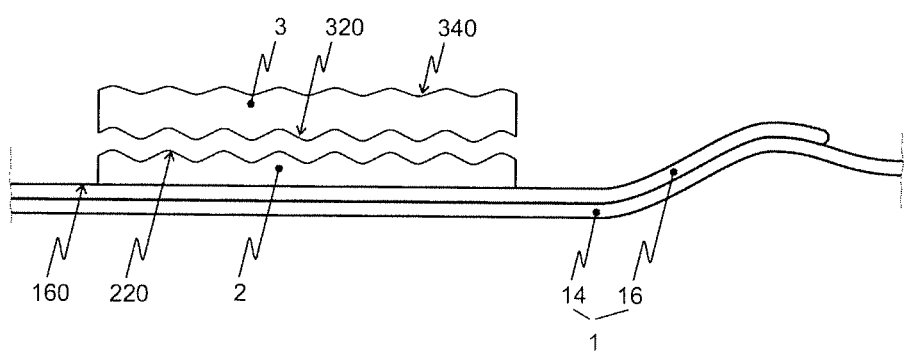
FIG. 2 shows a second power electronics assembly according to the invention.

FIG. 2 shows a second power electronics assembly according to the invention. Illustrated is a flexible substrate 1, here configured so as to have an insulation material film/foil 14 as a substrate carrier, having a thickness of 50 µm. A metallic foil 16 which configures a conductor path and has a thickness of 80 µm is disposed on said insulation material film/foil 14. It is an industry standard for also a very thin precious metal layer to be disposed on said metallic foil 16, said thin precious metal layer thus having a first surface 160.

A pressure-sintered connection here also configures the electrically conducting, materially integral connection between said conductor path 16 and a power semiconductor element 3. To this end, the power semiconductor element has a third surface 320 that faces the first surface, a thin precious metal layer again being disposed on said third surface 320.

An adhesion layer 2 which again is configured here as a sintered metal layer is disposed between the first surface 120 and the third surface 320. The sintered metal layer 2 here has a mean thickness of approx. 15 µm across the entire extent. The second surface 220 according to the invention moreover has a first consistent surface contour having a first roughness. The surface contour of the second surface 220 in the case of this first power electronics assembly is configured in a regular manner. The first roughness of the second surface 220 here has a value Ra of approx. 2 µm.

The power semiconductor element 3 is illustrated so as to be spaced apart purely for reasons of clarity. The power semiconductor element 3 here has a thickness of approx. 60 µm. The third surface 320 of the power semiconductor element 3 contacts the second surface 220 across the entire area.

The fourth surface 340 of the power semiconductor element 3 according to the invention has a second surface contour having a second roughness, wherein the second surface contour again follows the first surface contour. The second roughness of said fourth surface 340 is approx. 99% of the value of the first roughness. In other words, the structure of the sintered layer 2 is quasi completely reproduced on the fourth surface 340 of the power semiconductor element 3 and is again identifiable without visual aids.

In order for the first surface contour having the first roughness to be configured, the desired first surface contour can be configured in method step c) of the method according to the invention in that a sintered material is applied by means of a screen printing method, on account of which with a suitable choice of the screen structure and the viscosity of the sintered material a surface contour is automatically configured. At this point of time of embossing the roughness can still have a value which is higher than the value of the second surface of the later sintered metal layer.

Figure 3:
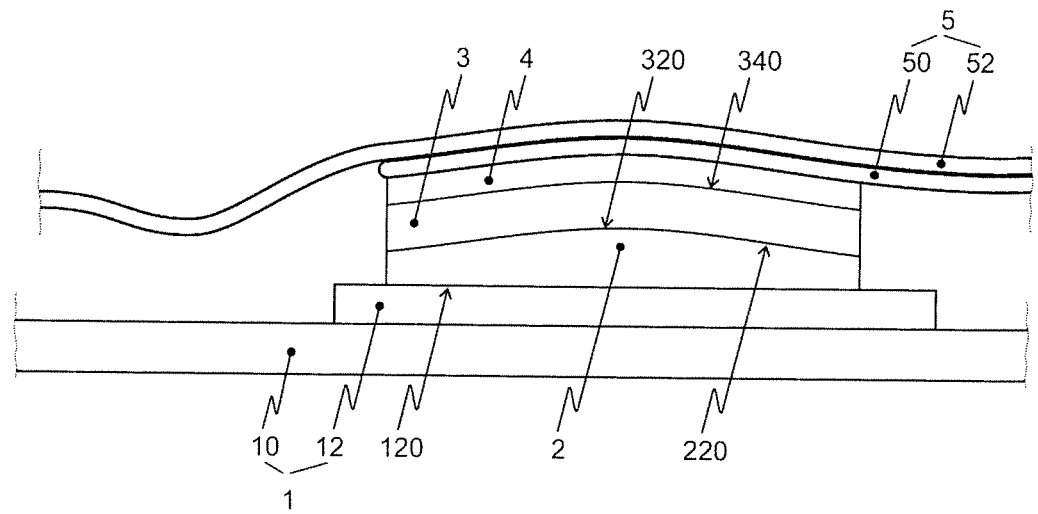
FIG. 3 shows a third power electronics assembly according to the invention, having an additional connection installation.

FIG. 3 shows a third power electronics assembly according to the invention having an additional connection installation 5, in a manner similar to that according to FIG. 1. The substantial difference here lies in that the adhesion layer 2, here an adhesive layer, does not have a uniform mean thickness, but in the centre of the power semiconductor element 3 has a first mean thickness of approx. 80 µm, while the mean thickness in the peripheral region of the power semiconductor element 3 is approx. 70 μm. A camber of this type of the power semiconductor element 3 is not problematic for reasons already mentioned above, specifically for reasons of the minor thickness of said power semiconductor element 3.

In principle, the second surface 220 and the fourth surface 340, without being explicitly illustrated here, have a surface contour according to the invention with an assigned first and second roughness, respectively.

In the context of the assigned method, the respective adhesive layer in the non-crosslinked state is applied to the first surface 120 of the conductor path 12 in step b). An adhesive having a high viscosity is used herein. Thereafter, the power semiconductor element 3 is disposed on the adhesive layer 2 and is fixed by means of a stamp which has a defined surface contour including a curvature, until the crosslinking of the adhesive has been performed to a sufficient extent such that the shape of the second surface 220 of the adhesion layer 2 is no longer modified or at least is no longer substantially modified.

Figure 4:
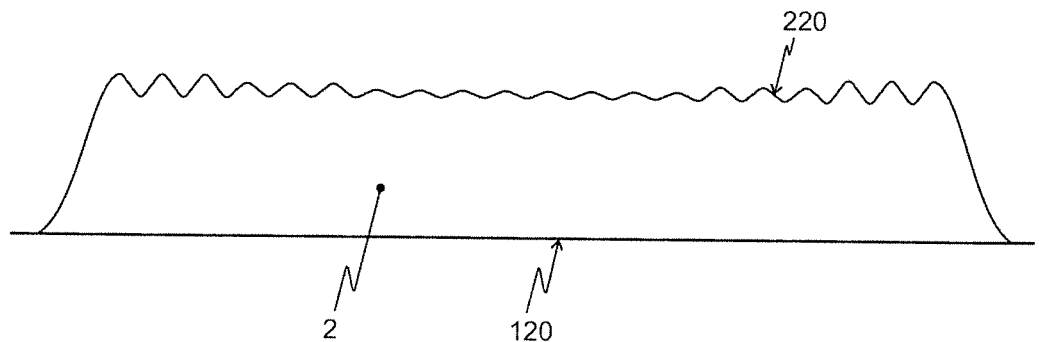
FIGS. 4 and 5 show special design embodiments of a third surface of a power electronics assembly according to the invention.
Figure 5:
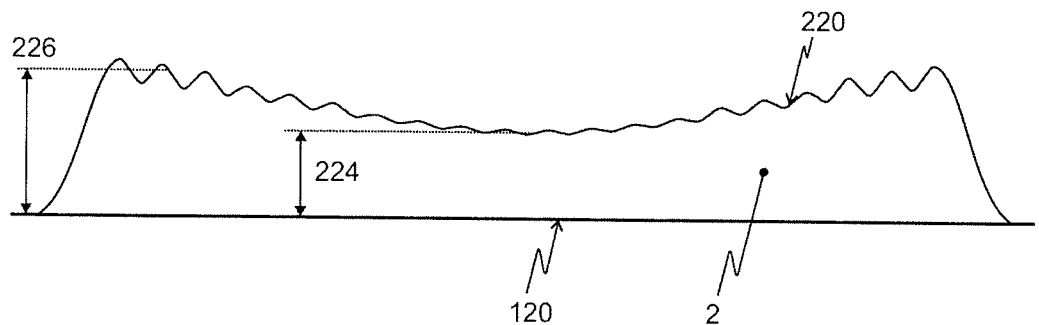

FIGS. 4 and 5 show special design embodiments of a second surface 220 of a power electronics assembly according to the invention. Illustrated in each case is an adhesion layer 2, preferably a layer from a sintered metal, which has a first surface contour. These layers, as a sintered material, have been applied to a conductor path 12 by means of a stencil printing method in the context of the production method, and the surface has subsequently been structured by means of an embossing method, that is to say that the surface structure has been configured so as to have a defined roughness.

Upon having transformed the sintered material by means of a pressure-sintering method into a layer from sintered metal 2, the second surface 220 according to FIG. 4 in the centre, the latter also corresponding to the centre of a power semiconductor element 3 to be disposed, has a roughness having a value that corresponds to approximately half the value of the roughness on the periphery, the latter also corresponding to the periphery of the power semiconductor element 3 to be disposed. This value of the roughness thus steadily increases from the centre towards the periphery.

The roughness of the second surface 220 according to FIG. 5 corresponds to the roughness according to FIG. 4. However, in the case of this layer from sintered metal the first mean thickness 224 in the centre is smaller than on the periphery. The second mean thickness 226 on the periphery is approx. 5% higher than that in the centre.

Having described at least one of the preferred embodiments of the present invention with reference to the accompanying drawings, it will be apparent to those skills that the invention is not limited to those precise embodiments, and that various modifications and variations can be made in the presently disclosed system without departing from the scope or spirit of the invention. Thus, it is intended that the present disclosure cover modifications and variations of this disclosure provided they come within the scope of the appended claims and their equivalents.

What is claimed is:

1. A power electronics assembly, comprising:
    a substrate having a power semiconductor element and an adhesion layer disposed therebetween;
    the substrate has a first surface that faces the power semiconductor element;
    the power semiconductor element has a third surface that faces the substrate;
    the adhesion layer has a second surface which contacts the third surface and has a first consistent surface contour having a first roughness;
    a fourth surface of the power semiconductor element that is opposite the third surface has a second surface contour having a second roughness, said second surface contour following the first surface contour, the first roughness being different than the second roughness;
    wherein the first roughness is configured so as to vary from a center of the power semiconductor element towards an outside of said power semiconductor element; and
    a value of the second roughness is between 50% and 100%, of a value of the first roughness.

2. The power electronics assembly, according to claim 1, wherein: a first mean thickness of the adhesion layer, determined in the center of the power semiconductor element, is between 10 μm and 200 μm.

3. The power electronics assembly, according to claim 1, wherein: the first roughness has a value between 5% and 50%, of the first mean thickness of the adhesion layer.

4. The power electronics assembly, according to claim 1, wherein: the adhesion layer is configured as one of an adhesive connection layer, a solder layer, and a sintered metal layer.

5. The power electronics assembly, according to claim 4, wherein:
    a second mean thickness of the adhesion layer, determined on the periphery of the power semiconductor element, has a value of at maximum 95% of the first mean thickness.

6. The power electronics assembly, according to claim 1, wherein:
    the substrate is configured to be rigid; and
    said substrate is further configured to have a ceramic substrate carrier having a metallic conductor path disposed thereon.

7. The power electronics assembly, according to claim 1, wherein:
    the substrate is configured to be flexible; and
    said substrate is further configured to have a film/foil-type, electrically isolating substrate carrier having a metallic conductor path disposed thereon.

8. A method for producing an assembly according to claim 1, comprising the steps, in one of a first sequence a-b-c-d-e, wherein steps b) and c) can be carried out simultaneously and a second sequence a-c-b-d-e, of:
    a) providing the substrate and the power semiconductor element;
    b) disposing the adhesion layer on the first surface of the substrate;
    c) structuring the second surface of the adhesion layer for configuring a consistent surface structure having a first roughness that varies from a center of the power semiconductor element towards an outside of said power semiconductor element;
    d) disposing the power semiconductor element, wherein the third surface having a second roughness that is different from the first roughness thereof comes to lie on the second surface of the adhesion layer, wherein the value of the second roughness is between 50% and 100%, of the value of the first roughness; and
    e) connecting the power semiconductor element to the adhesion layer.

9. The method, according to claim 8, wherein:
the adhesion layer is disposed on the first surface of the substrate by means of a screen printing method, and the surface structure is at least initially configured by the screen printing method.

10. The method, according to claim 8, wherein:
the adhesion layer is disposed on the first surface of the substrate by means of a stencil printing method.

11. The method, according to claim 10, wherein:
the surface structure is generated by an embossing stamp.

12. The method, according to claim 8, wherein:
the adhesion layer is disposed on an intermediate carrier, in particular a carrier plate or a carrier film/foil, and is disposed from the intermediate carrier onto the first surface of the substrate by means of a transfer method.

13. The method, according to claim 12, wherein:
the surface structure is generated by a negative structure of a fifth surface of the intermediate carrier.

\* \* \* \* \*